United States Patent [19]

Gioscia

[11] Patent Number: 5,644,303

[45] Date of Patent: *Jul. 1, 1997

[54] SPECIALIZED SHAPED UNIVERSAL REMOTE COMMANDER

[75] Inventor: Richard Gioscia, Mahwah, N.J.

[73] Assignees: Sony Corporation, Tokyo, Japan; Sony Electronics, Inc., Park Ridge, N.J.

[*] Notice: The term of this patent shall not extend beyond the expiration date of Pat. No. 5,457,448.

[21] Appl. No.: 379,090

[22] Filed: Jan. 26, 1995

Related U.S. Application Data

[63] Continuation of Ser. No. 69,879, Jun. 1, 1993, abandoned.

[51] Int. Cl.$^6$ ........................................ H04Q 1/00
[52] U.S. Cl. ................... 340/825.72; 340/825.69; 340/825.25; 455/348; 341/176; 200/5 A
[58] Field of Search ................. 340/825.72, 825.69, 340/825.24, 825.22, 825.25; D14/218; 248/346, 364.1, 188.9; 379/428, 433, 434, 454; 359/148; 341/176, 23; 200/5 A; 455/89, 90, 128, 347, 348

[56] References Cited

U.S. PATENT DOCUMENTS

| D. 183,700 | 10/1958 | Mason | D14/218 |
| D. 317,310 | 6/1991 | Schwartz | D14/218 |
| D. 342,258 | 12/1993 | Saito | D14/218 |
| 4,045,777 | 8/1977 | Mierzwinski | 340/825.72 |
| 4,817,203 | 3/1989 | Tsurumoto | 359/148 |
| 5,164,723 | 11/1992 | Nebenzahl | 341/23 |
| 5,229,701 | 7/1993 | Léman | 455/90 |

OTHER PUBLICATIONS

8–in–1 Universal Remote Control, The Tandy Corporation 1990.

*Primary Examiner*—Brian Zimmerman
*Attorney, Agent, or Firm*—Jay H. Maioli

[57] ABSTRACT

A universal remote commander provided as a replacement for an original remote control unit has a specialized shape, which is intended to be easily held and gripped in the hand, employs only a minimum number of controls that are used in conjunction with a function selection switch that selects either television, VCR, or cable, for example. The specialized housing is V-shaped in orthogonal cross sections so that it is wider at the top than at the bottom in the front view, whereas it is narrower at the top and wider at the bottom in the side view so as to achieve a generally cylindrical feel when held in the hand. A rotary knob can be employed at the bottom of the housing to act as the function selector switch or the rotary knob can be spring loaded and to act as a jog switch when controlling a VCR. A keypad can include translucent buttons that can be lit from inside the remote commander for use in dimly lighted rooms.

1 Claim, 5 Drawing Sheets

SPECIALIZED SHAPED UNIVERSAL REMOTE COMMANDER

This is a continuation of application Ser. No. 08/069,879 filed Jun. 1, 1993 now abandoned.

BACKGROUND OF THE INVENTION

1. Field of the Invention

The present invention relates generally to remote control units and, more particularly, to a universal remote commander intended to control various pieces of electronic apparatus and that has a specialized shape that is easily gripped in the user's hand.

2. Description of the Background

Almost all units of electronic equipment that are sold today include a remote control unit. These remote control units are generally all different and typically the specific remote control unit must be used in conjunction with its dedicated electronic apparatus. These remote control units frequently wear out and replacement is somewhat difficult for older units. In addition, as electronic apparatus in general becomes more complex, the remote control units employ more and more switches and buttons that are to be actuated by the user of the equipment. Moreover, as such remote control units become more complex their size and shape becomes less convenient to handle. Generally, the remote control unit employs a long flat rectangular housing that is somewhat inconvenient in use and tends to be misplaced because it is flat and is easily covered by newspapers or the like.

Thus, the conventional remote control units are frequently unwieldy and subject to being easily misplaced and, moreover, are subject to being overly complex by having a multitude of actuating elements for use by the user.

OBJECTS AND SUMMARY OF THE INVENTION

Accordingly, it is an object of the present invention to provide a universal remote commander for controlling electronic apparatus that can eliminate the above-noted defects inherent in the prior art.

Another object of this invention is to provide a remote commander that is of a size and shape that is easily held and gripped by the hand of the user.

It is another object of the present invention to provide a remote commander that has a function select switch that selects which one of various electronic units is to be controlled by the remote commander.

A further object of the present invention is to provide a universal remote commander that has a generally simplified keypad but that can control various units of electronic apparatus in conjunction with a function select switch.

A further object of the present invention is to provide a special V-shaped housing that is wider at the top than it is at the bottom in one cross-section and, in an orthogonal cross-section, is narrower at the top than it is at the bottom. This provides an overall cylindrical shape that is more easily held and manipulated by the user than a flat housing.

A still further object of the present invention is to provide a remote commander that has an elongate, cylindrical shape with a flat bottom that may be placed to stand upright on a flat surface. In conjunction with this shape, a special stand is provided that has an aperture for receiving the flat bottom of the remote commander.

Another object of the present invention is to provide a remote control unit that has a generally flat bottom that can incorporate a rotary knob or selector switch in the flat bottom.

The above and other objects, features, and advantages of the present invention will become apparent from the following detailed description of the illustrative embodiments thereof to be read in conjunction with the accompanying drawings in which like reference numerals represent the same or similar elements.

DETAILED DESCRIPTION OF PREFERRED EMBODIMENTS

Figure 1:
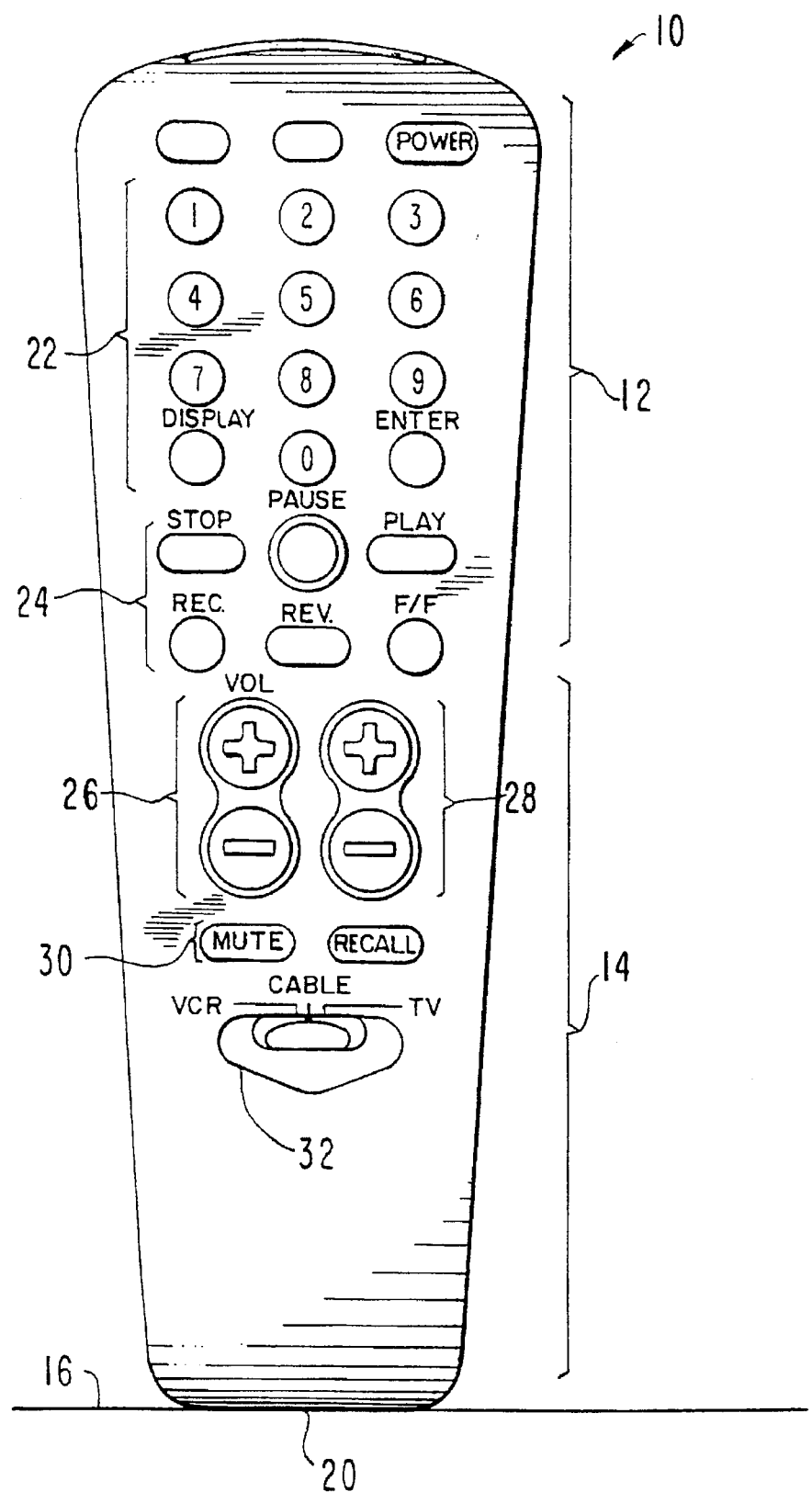
FIG. 1 is a front elevational view of a remote commander according to an embodiment of the present invention.

FIG. 1 shows a remote commander 10 according to an embodiment of the present invention and particularly the shape of the remote commander is seen to be wider at the top 12 than at the bottom 14. By providing this shape, the remote commander 10 is easily grasped in the hand of the user. Furthermore, the remote commander 10 is resting on a flat surface as seen at 16 and resides in an upright position. Therefore, the flat bottom 20 of the remote commander 10 is an important feature of the present invention. In addition, as shown in connection with FIG. 5, the flat bottom portion can be rotatably attached to the main body unit so that it can be rotated and serve either as a function select switch or, when controlling a video tape recorder, as a jug switch, for example.

In view of the specialized shape of the remote commander 10, the lay out of the keypad is dictated accordingly. Specifically, the standard numerical keypad 22 is provided along with other keys 24 for controlling a video tape recorder and the like such as stop, play, fast forward, and pause. By providing the remote commander to be wider at the top 12 than at the bottom 14, the keys that are required to be grouped together can be provided at the wider area, whereas the keys that need not be grouped together, that is, that consist of one or two independent switches are arranged at the narrower portion 12 of the hand-held unit. Specifically, the up/down volume control switches and the up/down channel select switches 28 are at the narrow end 14. Also, muting and recall switches 30 are provided below the volume and channel select switches 26, 28.

Figure 5:
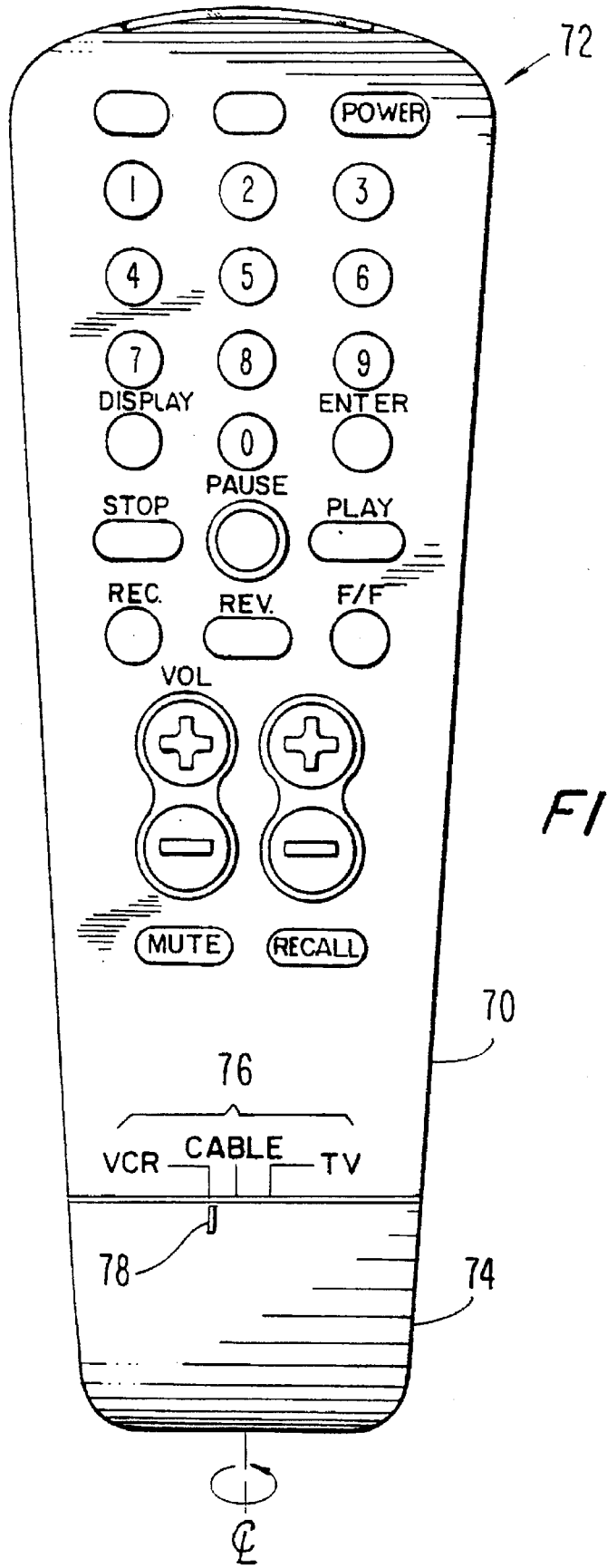
FIG. 5 is an elevational view of a remote commander having a rotary base function selector according to another embodiment of the present invention.

A function select switch 32, in the form of a slide switch in this embodiment, is provided so that the user can select the VCR, cable, or the television. As noted above, this slide switch can be incorporated as a rotary switch in the bottom of the universal remote commander, which is shown in FIG. 5.

Figure 2:
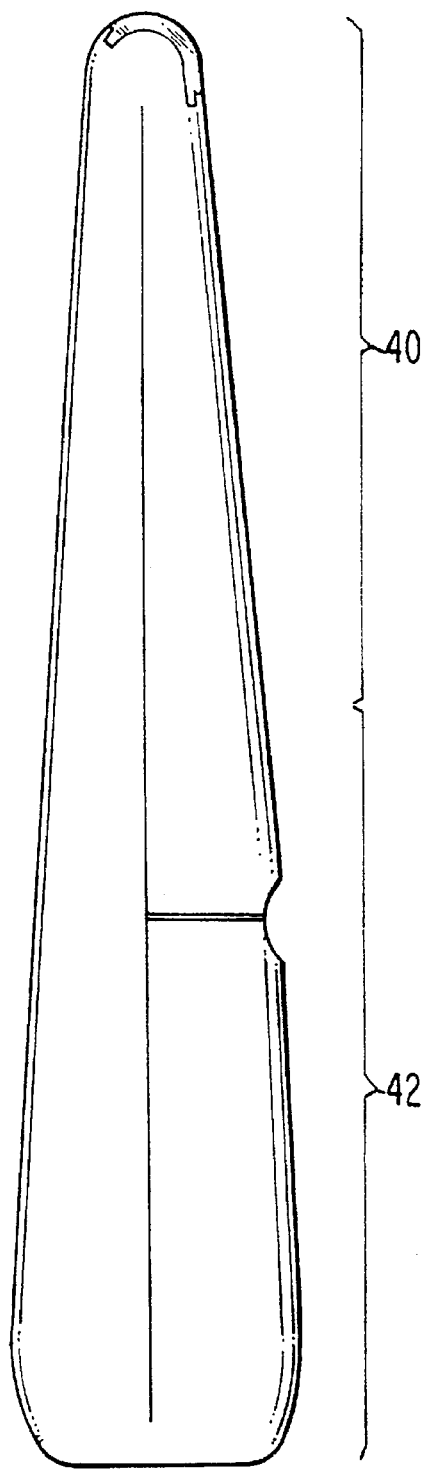
FIG. 2 is a side elevational view of the remote commander of FIG. 1.

FIG. 2 is a side view that shows the remote commander is narrower at the top area 40 than at the bottom area 42 and when viewed in conjunction with FIG. 1, it is seen that these two reverse tapers in orthogonal cross sections result in a unit that is sensed by the hand of the user to be generally a cylinder, even though the unit is not strictly a cylindrical shape.

Figure 3:
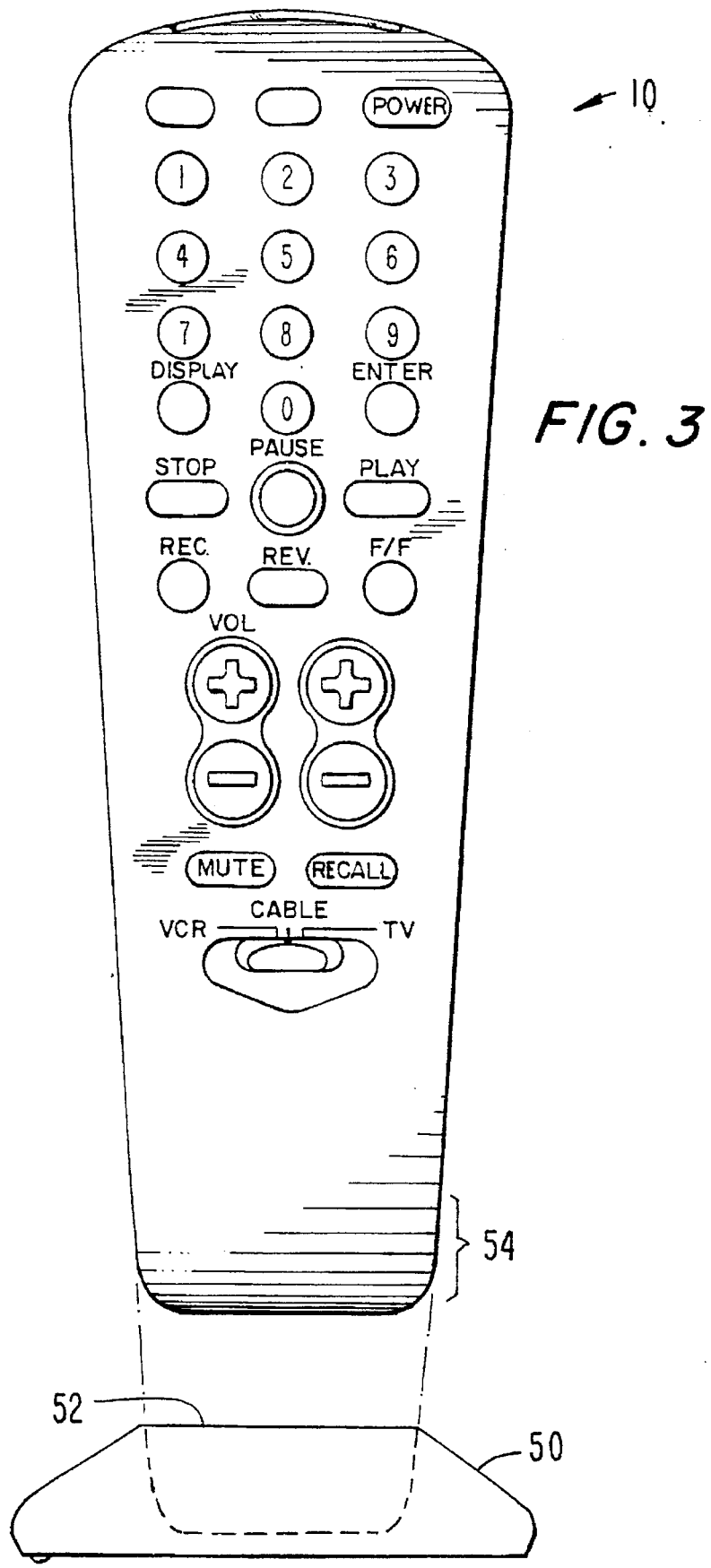
FIG. 3 is a remote commander of FIG. 1 shown in position above the stand used to retain the commander in the upright position.

FIG. 3 shows the remote commander 10 used in conjunction with a base or stand 50, and it is seen that an aperture 52 formed in the top of the base is intended to receive a bottommost portion 54 of the remote commander 10, so that the unit will remain in the upright position.

Figure 4:
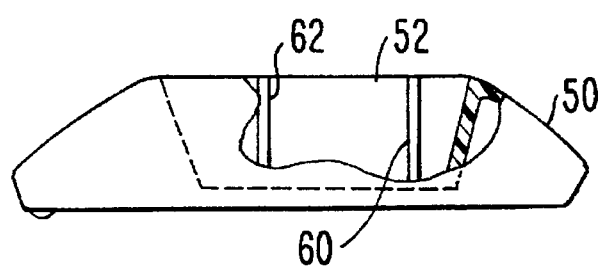
FIG. 4 is an elevational view in partial cross section of the base used in the embodiment of FIG. 3.

FIG. 4 shows the base 50 in more detail and, specifically, two of the three or more upraised ribs 60, 62 that cooperate with the outer surface of the bottommost portion 54 of the remote commander are seen. The ribs 60, 62 permit the unit 10 to be securely fitted into the base 50 and reside in the upright condition.

In the embodiment of FIG. 5, the selection switch is inside the main body 70 of the remote commander 72 and the bottommost portion 74 is mounted to rotate relative to the main body 70. Thus, rotation of portion 74 rotates the selector switch (not seen) inside the main body 70 and the function of the apparatus is selected. Indicia, shown generally at 76, are provided to show the user the selected function in conjunction with mark 78 on the rotary bottom 74.

Figure 6:
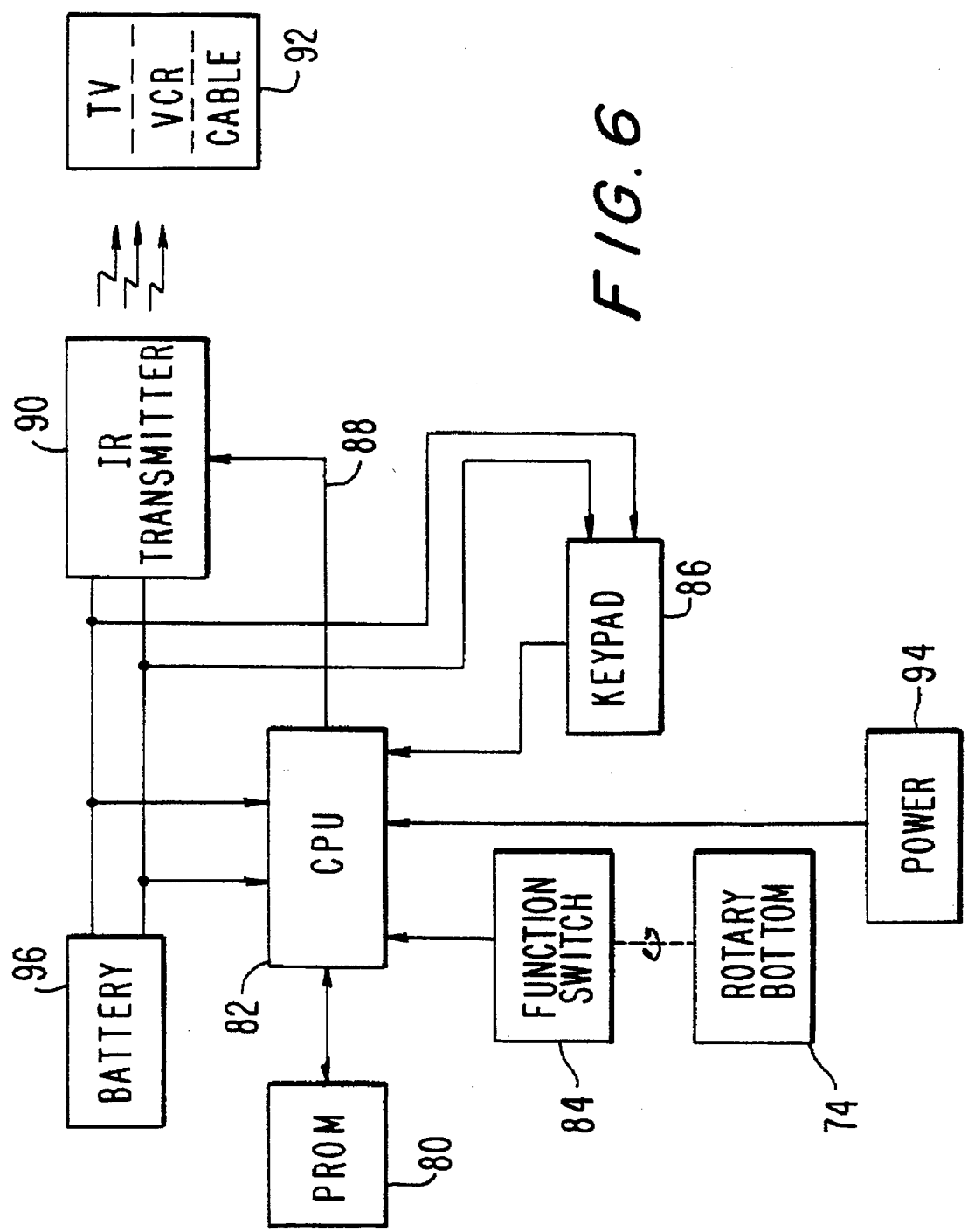
FIG. 6 is a schematic in block diagram form of the remote commander shown in FIGS. 1 and 5.

The remote commander 10 is intended to be a universal unit and, thus, to operate various kinds of equipment, as well as apparatus produced by various manufacturers. Accordingly, a memory is provided in the remote commander that has stored therein the command protocols for various units, as well as for equipment produced by various manufacturers. More specifically, FIG. 6 shows a schematic of the general electronics contained within the universal remote commander 10 or 72 and a programmable read only memory 80 is provided that contains all of the above protocol information. A central processing unit 82 then interprets the protocols based upon inputs from the function switch 84 and the keypad 86 and produces the command signals on line 88 fed to the infra-red ray transmitter 90 that transmits the appropriate control commands by infra-red radiation to the television or VCR or cable unit, shown generally at 92. The function switch 84, as noted above, permits the selection of the unit to be controlled and the keypad 86, as actuated by the user, then determines what signals are sent. The remote commander typically has a power switch 94 that controls the on/off state of the unit being controlled.

As is known, the central processing unit 82 and the transmitter 90 are powered by a battery 96 and the present invention also contemplates an illuminated keypad 86, so that the keypad 86 is also connected to the battery 96. The keypad 86 may be illuminated with a light source behind translucent, plastic keys, for example.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A universal remote control unit for controlling operations of a plurality of electronic apparatus, comprising:

an elongate main body element having a shape and size for being gripped in a hand of a user, the shape being wider at an upper end than at a lower end in a first cross section and in a second cross section orthogonal to the first cross section the shape being narrower at the upper end than at the lower end;

a flat bottom portion rotatably attached to the main body element at the lower end, so that the main body element stands upright on a flat surface;

a keypad arranged on the main body element and having a plurality of switches for actuation by the user of the remote control unit;

programmable memory for storing command protocols for the plurality of electronic apparatus;

a selector switch for selecting functions of the plurality of electronic apparatus being controlled, the selector switch being mounted inside the main body element and being mechanically connected for actuation by movement of the flat bottom portion; and control signal transmitter means for transmitting control signals to the plurality of electronic apparatus being controlled in response to actuation of one of the plurality of switches of the keypad, wherein the control signals are based on the command protocols stored in the programmable memory and the selector switch is actuated by the user of the remote control unit rotating the flat bottom portion relative to the main body element.

* * * * *